US008836431B2

(12) United States Patent
Han et al.

(10) Patent No.: US 8,836,431 B2
(45) Date of Patent: Sep. 16, 2014

(54) HIGH-EFFICIENCY POWER AMPLIFIER WITH MULTIPLE POWER MODES

(75) Inventors: Choong Soo Han, Seoul (KR); Jung Min Oh, Seoul (KR); Sang Hwa Jung, Ansan (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 364 days.

(21) Appl. No.: 12/952,620

(22) Filed: Nov. 23, 2010

(65) Prior Publication Data

US 2012/0126887 A1      May 24, 2012

(51) Int. Cl.
H03F 3/68       (2006.01)
H03F 3/21       (2006.01)
H03F 3/72       (2006.01)
H03F 1/02       (2006.01)

(52) U.S. Cl.
CPC ...... H03F 1/0277 (2013.01); *H03F 2203/7233* (2013.01); *H03F 3/211* (2013.01); *H03F 2203/7236* (2013.01); *H03F 2203/21139* (2013.01); *H03F 2203/21142* (2013.01); *H03F 3/72* (2013.01); *H03F 2203/21103* (2013.01); *H03F 2203/21106* (2013.01); *H03F 3/68* (2013.01)
USPC .......................... 330/295; 330/124 R; 330/51

(58) Field of Classification Search
CPC ........................................................ H03F 3/68
USPC ......................................... 330/51, 124 R, 295
See application file for complete search history.

(56) References Cited

U.S. PATENT DOCUMENTS

| | | | |
|---|---|---|---|
| 6,366,788 B1 * | 4/2002 | Fujioka et al. | 455/553.1 |
| 6,545,542 B2 * | 4/2003 | Matsuyoshi et al. | 330/301 |
| 7,005,919 B2 * | 2/2006 | Petrovic et al. | 330/149 |
| 7,436,257 B2 | 10/2008 | Park et al. | |
| 7,688,137 B2 | 3/2010 | Park et al. | |
| 7,714,647 B2 | 5/2010 | Jeon et al. | |
| 2009/0045877 A1 | 2/2009 | Wang et al. | |
| 2010/0253435 A1 * | 10/2010 | Ichitsubo et al. | 330/295 |

FOREIGN PATENT DOCUMENTS

EP          1612932 A1      1/2006

* cited by examiner

*Primary Examiner* — Robert Pascal
*Assistant Examiner* — Khiem Nguyen

(57) ABSTRACT

In a representative embodiment, a multiple mode power amplifier that is operable in a first power mode and a second power mode. The multiple mode power amplifier comprises a first amplifying unit; a second amplifying unit; a first impedance matching network connected to an output port of the first amplifying unit; a second impedance matching network connected to an output port of the second amplifying unit and to the first impedance matching network; and a third impedance matching network connected to the output ports of the first and the second amplifying units. The third impedance matching network reduces a phase difference between signals amplified by the first and the second amplifying units in the first mode.

18 Claims, 3 Drawing Sheets

HIGH-EFFICIENCY POWER AMPLIFIER WITH MULTIPLE POWER MODES

BACKGROUND

The demand for smaller and lighter devices used in wireless communications (e.g., cellphones) continues. Often, this means that the size of batteries incorporated in these devices is also desirably smaller. Concomitantly, the desired duration of active use of the wireless device, without interruption for recharging, is increasing. As such, it is desired to provide power to the device over a longer duration with a battery of reduced size In a device for wireless communication, a radio frequency (RF) power amplifier drains most of the power consumed by the device. For this reason, much effort has been given to enhancing the efficiency of the RF power amplifier. As a result, multiple mode power amplifiers have been developed.

In a multiple mode power amplifier, it is possible to switch between a high power mode and a low power mode. For example, when the device is located at a comparatively large distance from a base station the multimode power amplifier operates in high power mode; and when the device is located at a comparatively short distance from a base station, the multimode power amplifier operates in low power mode. In a known multiple mode power amplifier the switching between high power mode and low power mode is effected with an RF switch.

However, the incorporation of an RF switch into the power amplifier of a device for wireless communications adds to the overall cost of the device. Further, RF switches have a negative gain, which may reduce the overall efficiency of the power amplifier. Accordingly, there is a need to provide a power amplifier that does not require an RF switch.

However, there are drawbacks to known multiple mode power amplifiers that do not include an RF switch. For example in certain known multiple mode power amplifiers, when operating in the high power mode, an RF signal is transferred to two amplifying stages. The two signals amplified by the respective stages have different phases. As such, when they are superimposed together at an output, a power loss may take place due to a phase difference therebetween, causing a decrease in the efficiency of the multiple mode power amplifier. Moreover, when the known multiple mode power amplifier operates in the low power mode, it is required to flow a low output current at an output port of a second amplifying stage in order to reduce the power consumption of the multiple mode power amplifier. In order to reduce the output current, an inductor of a comparatively high inductance (e.g., from about 2 to 4 nH) is used in an impedance matching network at the output of the second amplifying stage. However, in order to have such high inductance, the size of an inductor (and, therefore, a power amplifier employing such inductor) must be comparatively large. Ultimately, the goal of providing a wireless communication device of reduced size is compromised.

SUMMARY

In a representative embodiment, a multiple mode power amplifier is operable in a first power mode and a second power mode. The multiple mode power amplifier comprises a first amplifying unit; a second amplifying unit; a first impedance matching network connected to an output port of the first amplifying unit; a second impedance matching network connected to an output port of the second amplifying unit and to the first impedance matching network; and a third impedance matching network connected to the output ports of the first and the second amplifying units. The third impedance matching network reduces a phase difference between signals amplified by the first and the second amplifying units in the first mode.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Figure 1:
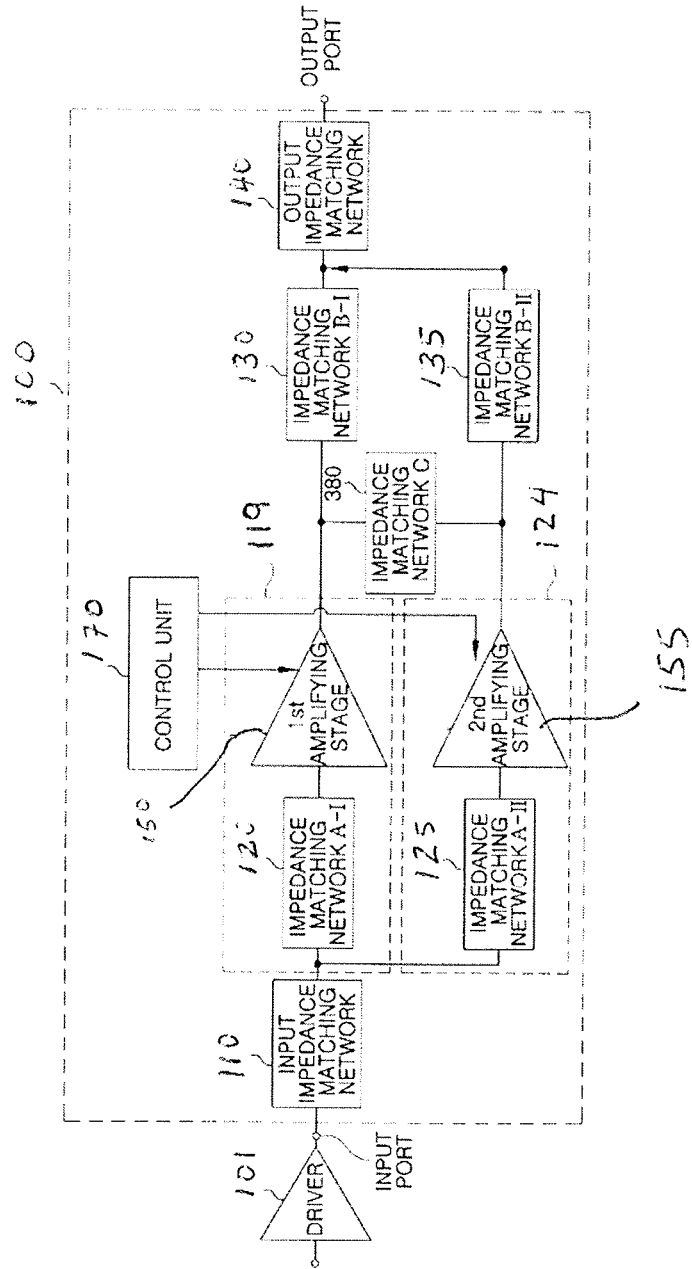
FIG. 1 illustrates a block diagram of a high-efficiency multiple mode power amplifier in accordance with a representative embodiment.

FIG. 1 illustrates a block diagram of a multiple mode power amplifier 100 in accordance with a representative embodiment.

The power amplifier 100 comprises an input impedance matching network 110; a first amplifying unit 119; a second amplifying unit 124; an impedance matching network B-I 130; an impedance matching network B-II 135; an impedance matching network C 180; an output impedance matching network 140; and a control unit 170.

The multiple mode power amplifier 100 receives an RF signal from a driver 101, amplifies it in a high or a low power mode determined depending on a desired output power level, and outputs the amplified RF signal.

The input impedance matching network 110, connected to the input port of the power amplifier 100, receives the RF signal through the input port of the power amplifier 100, and transfers it to both of the first and the second amplifying units 119 and 124.

Each of the first and the second amplifying units 119 and 124 receives the RF signal through the input impedance matching network 110 and amplifies the RF signal when activated. In particular, the first amplifying unit 119 includes an impedance matching network A-I 120 through which the RF signal is received and a first amplifying stage 150 which amplifies the received RF signal. The second amplifying unit 124 includes an impedance matching network A-II 125 through which the RF signal is received and a second amplifying stage 155 which amplifies the received RF signal.

The impedance matching network B-I 130, connected at the output port of the first amplifying stage 150, transfers the RF signal amplified by the first amplifying stage 150 to the output impedance matching network 140.

The impedance matching network B-II 135, connected at the output port of the second amplifying stage 155, transfers the RF signal amplified by the second amplifying stage 155 to the output impedance matching network 140.

Unlike the conventional multiple mode power amplifiers discussed above, the multiple mode power amplifier 100 of the representative embodiments comprises impedance matching network C 180, connected between the output ports of the first and the second amplifying stages 150 and 155. Impedance matching network 180 beneficially reduces a phase difference between the two signals amplified by the first and the second amplifying stages 150 and 155 when both of the first and the second amplifying stages 150 and 155 are activated.

The output impedance matching network 140 transfers the two signals amplified by the respective amplifying stages 150 and 155 to a load, for example, an antenna connected to the output port.

The control unit 170, connected to the bias stages of the first and the second amplifying stages 150 and 155, activates or deactivates the first and the second amplifying stages 150 and 155 depending on a power mode of the power amplifier 100. The operations of the power amplifier 100 will be described hereinafter.

When a power level higher than a predetermined reference value is required for the output signal, the power amplifier 100 operates in a high power mode. In the high power mode, the control unit 170 activates the first and the second amplifying stages 150 and 155. Further, in the high power mode of the power amplifier 100, the impedance matching network C 180 employs a capacitor which reduces the phase difference between the two signals amplified by the respective first and second amplifying stages 150 and 155. Beneficially, reducing the phase difference between the two amplified signals reduces a power loss incurred at the output impedance matching network 140. Ultimately, the efficiency of the power amplifier 100 can be accordingly enhanced.

When a power level lower than the reference value is required for the output signal, the power amplifier 100 operates in a low power mode. In the low power mode, the control unit 170 deactivates the first amplifying stage 150 but activates the second amplifying stage 155.

Further, the power amplifier 100 can also operate in an idle mode. In the idle mode, the control unit 170 deactivates the first and the second amplifying stages 150 and 155.

The first and the second amplifying stages 150 and 155 and the impedance matching networks B-I 130, B-II 135 and C 180 will now be further explained with reference to FIGS. 2A to 2C.

Figure 2A:
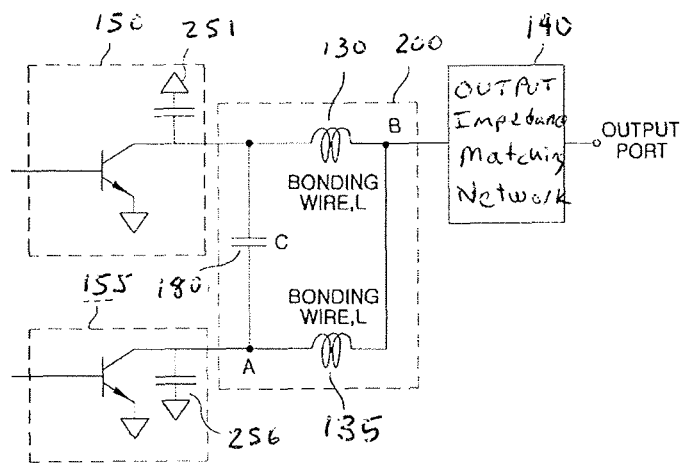
FIGS. 2A to 2C schematically provide a circuit diagram of a part of the multiple mode power amplifier shown in FIG. 2.

FIG. 2A illustrates a simplified circuit diagram of the first and the second amplifying stages 150 and 155, and the impedance matching networks B-I 130, B-II 135 and C 180, shown in FIG. 1.

Each of the first and the second amplifying stages 150 and 155 may have a number of transistors and a parallel capacitor 251 or 256 connected to the output port thereof. In order for the power amplifier 100 to provide a higher maximum output power in the high power mode (e.g., at least 10 dB higher) than the output power in the low power mode, the first amplifying stage 150 may comprise a greater number of transistors (e.g., ten times or more transistors) than the second amplifying stage 155. In other words, the maximum output power of the first amplifying stage 150 can be higher (e.g., at least 10 times higher) than that of the second amplifying stage 155.

On the other hand, as shown in FIG. 2A, the impedance matching networks 130 and 135 may comprise bonding wires inside an IC chip (not shown) on which the multiple mode power amplifier 100 is provided. The inductances of the bonding wires may range from about 0.2 to 0.4 nH. The impedance matching network 180 illustratively comprises a capacitor. The impedance matching networks 130, 135 and 180 form an impedance circuit 200.

When the multiple mode power amplifier 100 operates in the low power mode, since the deactivated first amplifying stage 150 provides a comparatively high impedance, the first amplifying stage 150 is essentially an open circuit; and, therefore, an output impedance of the second amplifying stage 155 is approximately the same as the impedance of the combination of the parallel capacitor 256 and the impedance circuit 200 connected to the output port of the second amplifying stage 155. The capacitance C of the capacitor of the impedance matching circuit 180 may have a value such that the combination circuit of the bonding wire of the impedance matching network 130 and the capacitor of the impedance matching network 180 is viewed as a capacitor 181 having a comparatively large value of capacitance C'. Notably, when appropriate value of capacitance C is used for the impedance matching network 180, since the inductance (L) of the bonding wire becomes comparatively small and an absolute value of the reactance thereof is smaller than that C of the capacitor of the impedance matching network 180, the combination circuit of the impedance matching network 180 and the impedance matching network 130 can be viewed as the capacitor 181 having a large value of capacitance C'. Hence, the impedance circuit 200 between node A and node B can be approximated as an equivalent parallel LC resonance circuit shown in FIG. 2B, having the capacitor 181 and the bonding wire of impedance matching network 135.

Figure 2B:
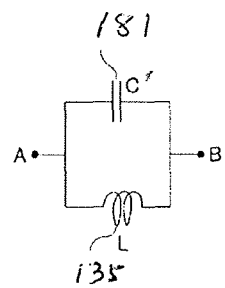
Figure 2C:

The impedance Z of the parallel LC resonance circuit depicted in FIG. 2B can be determined by the following equation:

$$z = \frac{jwL}{1 - w^2 LC'} \quad (1)$$

where w denotes the frequency of the RF signal, L denotes an inductance of the bonding wire of the impedance matching network 135, and C' denotes the capacitance of the capacitor 181.

When the capacitance C' of the capacitor 181 satisfies the condition given by equation (2) below, the LC resonance circuit presented in FIG. 2B becomes equivalent to the inductor circuit depicted in FIG. 2C with an inductance L' that is greater than that of the bonding wire impedance matching network 335:

$$0 < C < \frac{1}{w^2 L} \quad (2)$$

As should be appreciated, the impedance Z of the impedance circuit 200 between node A and node B becomes larger as the capacitance C becomes close to the value $1/(w^2 L)$.

In general, a bonding wire has a value of inductance ranging from about 0.2 to 0.4 nH, an inappropriately small value for a low output current. Thus, in order to lower the output current of the power amplifier, it would be required to use an additional inductor, at the output port of the amplifying stage, having a greater inductance than the bonding wire.

However, by employing the impedance matching network 180 between the output ports of the first and the second amplifying stages 150 and 155, a comparatively high inductance (e.g., 10 times or more) than that of the bonding wire is realized. Accordingly, it is no longer necessary to connect a separate inductor with a high inductance, which may have a large size and be comparatively expensive.

Figure 3:
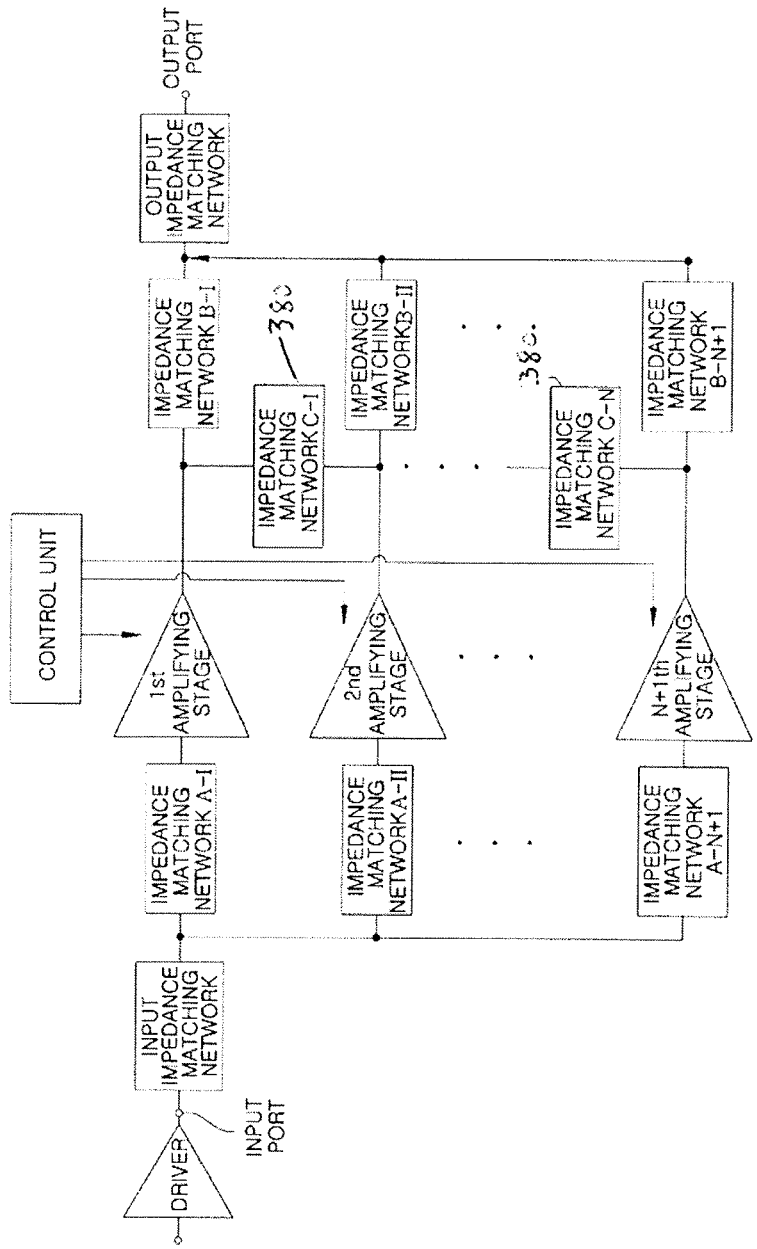
FIG. 3 describes a block diagram of a high-efficiency multiple mode power amplifier in accordance with a representative embodiment that is configured to operate in more than three power modes.

FIG. 3 depicts a block diagram of a high-efficiency multiple mode power amplifier that is operable in more than three power modes in accordance with another representative embodiment.

With the number of power amplifying stages increased to N+1 as shown in FIG. 3, the multiple mode power amplifier can operate in N+1 power modes. This amplifier is identical to the amplifier 100 in FIG. 1 except for the following two aspects.

First, as the number of amplifying stages of the power amplifier increases to N+1, N+1 impedance matching networks A–k(k=1~N+1) are connected to the input ports of the respective amplifying stages and N+1 impedance matching networks B–k(k=1~N+1) are connected to the output ports of the respective amplifying stages.

Secondly, N impedance matching networks C–i(i=1~N) 380 are employed. Specifically, the i-th impedance matching network C–i is connected between the output ports of the i-th and (i+1)-st amplifying stages, where i=I, . . . , N. The multiple mode power amplifier can operate in any i-th mode in which amplifying stages from the first up to the i-th are activated while the others remain deactivated. The impedance matching networks C–i(i=1~N) 380 may be formed with capacitors of suitable values that optimize the output impedances of the respective amplifying stages.

It should also be noted that the high-efficiency multiple mode power amplifier described above can be incorporated into an integrated circuit that can be used in a wireless communication device.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A multiple mode power amplifier that is operable in a first active power mode and a second active power mode, the multiple mode power amplifier comprising:
   a first amplifying unit;
   a second amplifying unit;
   a first impedance matching network connected to an output port of the first amplifying unit;
   a second impedance matching network connected to an output port of the second amplifying unit and to the first impedance matching network; and
   a third impedance matching network connected to the output ports of the first and the second amplifying units, and wherein the third impedance matching network reduces a phase difference between signals amplified by the first and the second amplifying units in the first active power mode.

2. An integrated circuit comprising the power amplifier of claim 1.

3. A wireless communication device comprising the power amplifier of claim 1.

4. A multiple mode power amplifier that is operable in a first active power mode and a second active power mode, the multiple mode power amplifier comprising;
   a first amplifying unit configured to provide a higher impedance when deactivated than when activated;
   a second amplifying unit;
   a first impedance matching network connected to an output port of the first amplifying unit;
   a second impedance matching network connected to an output port of the second amplifying unit and to the first impedance matching network; and
   a third impedance matching network connected to the output ports of the first and the second amplifying units, wherein the third impedance matching network reduces a phase difference between signals amplified by the first and the second amplifying units in the first active power mode.

5. The power amplifier of claim 4, wherein the third impedance matching network comprises a capacitor.

6. The power amplifier of claim 5, wherein when the power amplifier operates in the second mode, a capacitance of the capacitor is determined such that an impedance between the output port of the second amplifying unit and the other end of the second impedance matching network is higher than that of the second impedance matching network itself.

7. The power amplifier of claim 4, wherein each of the first and the second impedance matching networks includes a bonding wire.

8. The power amplifier of claim 7, wherein an inductance of each of the bonding wires ranges from about 0.2 to 0.4 nH.

9. The power amplifier of claim 4, wherein a maximum output power of the first amplifying unit is greater than that of the second amplifying unit.

10. The power amplifier of claim 9, wherein the maximum output power of the first amplifying unit is 10 times greater than that of the second amplifying unit.

11. A multiple mode power amplifier that is operable in a first power mode and a second power mode, the multiple mode power comprising:
    a first amplifying unit;
    a second amplifying unit;
    a first impedance matching network connected to an output port of the first amplifying unit;
    a second impedance matching network connected to an output port of the second amplifying unit and to the first impedance matching network;
    a third impedance matching network connected to the output ports of the first and the second amplifying units; and
    a control unit configured to selectively activate or deactivate the first and/or the second amplifying unit depending on a power mode of the power amplifier, wherein the third impedance matching network reduces a phase difference between signals amplified by the first and the second amplifying units in the first mode.

12. The power amplifier of claim 11, wherein the third impedance matching network comprises a capacitor.

13. The power amplifier of claim 12, wherein when the power amplifier operates in the second mode, a capacitance of the capacitor is determined such that an impedance between the output port of the second amplifying unit and the other end of the second impedance matching network is higher than that of the second impedance matching network itself.

14. The power amplifier of claim 11, wherein each of the first and the second impedance matching networks includes a bonding wire.

15. The power amplifier of claim 11, wherein a maximum output power of the first amplifying unit is greater than that of the second amplifying unit.

16. The power amplifier of claim 15, wherein the maximum output power of the first amplifying unit is 10 times greater than that of the second amplifying unit.

17. An integrated circuit comprising the power amplifier of claim 11.

18. A wireless communication device comprising the power amplifier of claim 11.

* * * * *